(12) United States Patent
Palmer et al.

(10) Patent No.: US 12,717,998 B1
(45) Date of Patent: Aug. 25, 2026

(54) POWER ROUTING REDUCTION IN CIRCUIT DESIGN FOR ELECTROSTATIC DISCHARGE CHECKING

(71) Applicant: Synopsys, Inc., Sunnyvale, CA (US)

(72) Inventors: Nicholas Stewart Palmer, Beaverton, OR (US); Chih Yi Huang, New Taipei City (TW); De-Shiuan Chiou, Taipei City (TW); Yu-Chen Lin, Taoyuan City (TW); Jeffrey Ellis Byrd, Greensboro, NC (US); Charles Samuel McFalls, Jr., Graham, NC (US); Chi Lo, New Taipei City (TW); Chi-Chun Chuang, Taipei City (TW)

(73) Assignee: Synopsys, Inc., Sunnyvale, CA (US)

( * ) Notice: Subject to any disclaimer, the term of this patent is extended or adjusted under 35 U.S.C. 154(b) by 697 days.

(21) Appl. No.: 18/205,830

(22) Filed: Jun. 5, 2023

Related U.S. Application Data

(60) Provisional application No. 63/348,937, filed on Jun. 3, 2022.

(51) Int. Cl.
*G06F 30/39* (2020.01)
*G06F 30/392* (2020.01)
*G06F 30/398* (2020.01)

(52) U.S. Cl.
CPC .......... *G06F 30/398* (2020.01); *G06F 30/392* (2020.01)

(58) Field of Classification Search
USPC ................................................ 716/110, 111
See application file for complete search history.

(56) References Cited

U.S. PATENT DOCUMENTS 7,089,526 B1 * 8/2006 Salowe ................ G06F 30/394 716/129
2011/0252388 A1 * 10/2011 Singhal .............. G06F 30/3312 716/108
2022/0231785 A1 * 7/2022 Beery .................. H04L 1/0052

* cited by examiner

*Primary Examiner* — Brian Ngo
(74) *Attorney, Agent, or Firm* — Weaver Austin Villeneuve & Sampson LLP

(57) ABSTRACT

A method for performing a computation associated with a layout of a circuit design includes, in part: generating a graph having a multitude of nodes disposed across a multitude of layers associated with the layout, wherein each node corresponds to a polygon in the layout, wherein the multitude of nodes includes a source node and a sink node; traversing from the source node to the sink node via the nodes in accordance with a rule enabling traversal between one or more of (i) nodes disposed in the same layer, and (ii) from a first node disposed in one of the layers to a node disposed in another layer that is higher than the first layer; pruning nodes that are not visited during the traversal; and maintaining nodes that are not pruned for use in the computation.

20 Claims, 6 Drawing Sheets

POWER ROUTING REDUCTION IN CIRCUIT DESIGN FOR ELECTROSTATIC DISCHARGE CHECKING

RELATED APPLICATION

The present application claims benefit under 35 USC 119 (e) of U.S. Patent Application No. 63/348,937, filed Jun. 3, 2022, the content of which is incorporated herein by reference in its entirety.

TECHNICAL FIELD

The present application relates to an electronic design automation (EDA) system, and more particularly to determination of the electrostatic discharge current in an integrated circuit (IC) design using an EDA system.

BACKGROUND

Determination of the electro-static discharge (ESD) current in a circuit design requires calculation and analysis of the voltages associated with polygons of the circuit design's layout. There are two major related parameters in making such calculations, namely point-to-point resistance (P2PR), and current density (CD). For both the P2PR and CD calculations, the parasitic resistances associated with polygons of the circuit layout are used to compute the nodal voltages along the injected current path. Such computations require considerable computing resources. As the circuit design sizes grow, the complexity and resources required for resistance extraction and nodal voltage analysis increases substantially.

SUMMARY

A method for performing a computation associated with a layout of a circuit design includes, in part: generating a graph having a multitude of nodes disposed across a multitude of layers associated with the layout, wherein each of the multitude of nodes corresponds to a polygon in the layout, wherein the multitude of nodes includes a source node and a sink node; traversing from the source node to the sink node via the multitude of the nodes in accordance with a rule enabling traversal between one or more of (i) nodes disposed in the same layer, and (ii) from a first node disposed in a first one of the multitude of layers to a second node disposed in a second one of the multitude of layers that is higher than the first one of the multitude of layers; pruning nodes that are not visited during the traversal; and maintaining nodes that are not pruned for the computation.

In one embodiment, the method further includes, in part: computing a multitude of ratios associated with thicknesses of the plurality of layers; reinserting the pruned nodes associated with layers having computed ratios that satisfy a first ratio and that are positioned at one or more of a same layer level and above the layer level associated with the first ratio; and using the maintained nodes and the reinserted nodes to perform the computation.

In one embodiment, the method further includes, in part, computing a resistance associated with each of the multitude of nodes. In one embodiment, the multitude of layers is a multitude of conductive layers. In one embodiment, the traversing from the source node to the sink node is performed in accordance with one or more of a breadth-first-search algorithm and a depth-first-search algorithm. In one embodiment, the computation involves computing an electro-static discharge current sourced by the source node and received by the sink node. In one embodiment, the computed ratios are equal to or less than the first ratio.

A system for performing a computation associated with a layout of a circuit design, includes, in part, a memory storing instructions; and a processor, coupled with the memory and to execute the instructions. The instructions when executed cause the processor to: generate a graph having a multitude of nodes disposed across a multitude of layers associated with the layout, wherein each of the multitude of nodes corresponds to a polygon in the layout, wherein the multitude of nodes includes a source node and a sink node; traverse from the source node to the sink node via the multitude of the nodes in accordance with a rule enabling traversal between one or more of (i) nodes disposed in a same layer, and (ii) from a first node disposed in a first one of the multitude of layers to a second node disposed in a second one of the multitude of layers that is higher than the first one of the multitude of layers; prune nodes that are not visited during the traversal; and maintain nodes that are not pruned for the computation.

In one embodiment, the instructions further cause the processor to: compute a multitude of ratios associated with thicknesses of the multitude of layers; reinsert the pruned nodes associated with layers having computed ratios that satisfy a first ratio and that are positioned at one or more of a same layer level and above the layer level associated with the first ratio; and use the maintained nodes and the reinserted nodes to perform the computation.

In one embodiment, the instructions further cause the processor to compute a resistance associated with each of the multitude of nodes. In one embodiment, the multitude of layers is a multitude of conductive layers. In one embodiment, the traversing from the source node to the sink node is performed in accordance with a breadth-first-search algorithm or a depth-first-search algorithm. In one embodiment, the computation involves computing an electro-static discharge current sourced by the source node and received by the sink node. In one embodiment, the computed ratios are equal to or less than the first ratio.

A non-transitory computer readable medium includes stored instructions, which when executed by a processor, cause the processor to: generate a graph having a multitude of nodes disposed across a multitude of layers associated with the layout, wherein each of the multitude of nodes corresponds to a polygon in the layout, wherein the multitude of nodes comprises a source node and a sink node; traverse from the source node to the sink node via the multitude of the nodes in accordance with a rule enabling traversal between one or more of (i) nodes disposed in a same layer, and (ii) from a first node disposed in a first one of the multitude of layers to a second node disposed in a second one of the multitude of layers that is higher than the first one of the plurality of layers; prune nodes that are not visited during the traversal; and maintain nodes that are not pruned for a computation associated with a layout of a circuit design.

In one embodiment, the instructions further cause the processor to: compute a multitude of ratios associated with thicknesses of the multitude of layers; reinsert the pruned nodes associated with layers having computed ratios that satisfy a first ratio and that are positioned at one or more of a same layer level and above the layer level associated with the first ratio; and use the maintained nodes and the reinserted nodes to perform the computation.

In one embodiment, the instructions further cause the processor to compute a resistance associated with each of the multitude of nodes. In one embodiment, the multitude of layers is a multitude of conductive layers. In one embodiment, the computation involves computing an electro-static discharge current sourced by the source node and received by the sink node. In one embodiment, the computed ratios are equal to or less than the first ratio.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
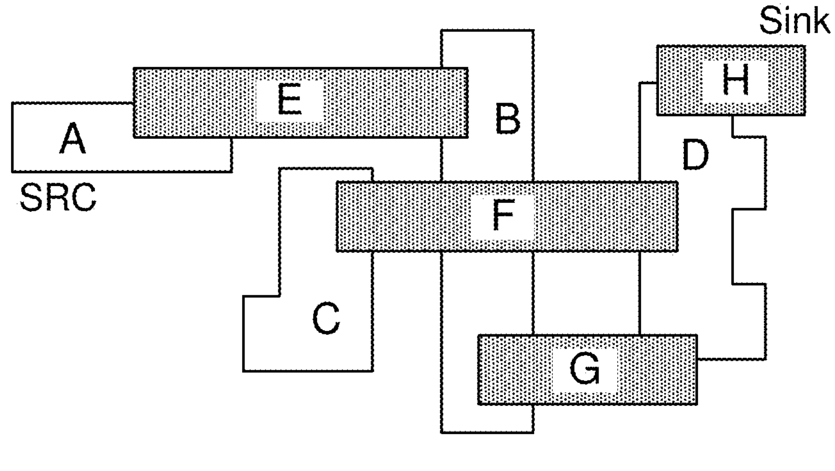
FIG. 1 shows examples of polygons associated with a pair of layers of a circuit layout.

Aspects of the present disclosure relate to power routing reduction in a circuit design for electrostatic discharge checking.

An aspect of a circuit design, prior to its manufacture, is the determination of the amount of the electro-static discharge (ESD) current. The ESD current may be determined by identifying the path that the current takes from the power supply terminal to the ground terminal via the various layers of the design as identified from the design's corresponding layout. The increasing complexity of both the circuit designs, as well as the numerous nodes corresponding to multiple layers involved in the semiconductor processes used to manufacture the circuit designs, have rendered the objective of determining the ESD current using some techniques unwieldy, cumbersome, time consuming, resource intensive and costly.

In accordance with embodiments of the present disclosure, the number of circuit nodes, as represented by polygons in the circuit layout, and as used in determining the ESD current, is reduced so as to increase the speed and reduce the cost of the ESD current determination. To achieve this, a directed graph that corresponds to the circuit design is generated. Thereafter, the directed graph is pruned so as to reduce the number of nodes through which the ESD current computation is made. Further analysis may be performed to reinsert nodes that were pruned earlier from the directed graph to enhance the accuracy of the ESD current computation.

Technical advantages of the present disclosure include, but are not limited to, an automated process in determining the ESD current that provides significant savings in both time and cost.

As described above, in accordance with one aspect of the present disclosure, a circuit design is represented as a graph that may be pruned relatively quickly to enable the downstream analysis that includes parasitic resistance extraction as well as P2RP and CD calculations, to be carried out in a relatively short time period, while maintaining relatively high accuracy.

In accordance with one embodiment, layer-order traversal and auto-layer preserving techniques, described in detailed below, are used to prune a graph representative of a circuit design. In accordance with the layer-order traversal, the graph is traversed to reduce the data size associated with the graph. Starting with current sources and current sinks, all graph nodes that are visited during the traversal are maintained, and all graph nodes that are not visited are pruned. Layer-order information (i.e., the stack of layers of material formed to manufacture the circuit) is used during the traversal. In accordance with one embodiment, layer-order traversal occurs from a lower layer to the same or a higher layer. Therefore, layer-order traversal may not occur from a higher layer to a lower layer. As a consequence, current signal paths with relatively small impact on the P2RP and CD calculations are discarded, thereby significantly reducing the size of the data used in calculating the P2RP and CD.

To further improve accuracy, an auto-layer preserving technique is used to identify layers that may have been pruned but are deemed as having a relatively non-trivial impact in calculating the P2RP and CD. Such layers having a relatively non-trivial impact may be determined using an auto-layer preserving method based on a ratio between the thicknesses of different layers. Accordingly, such layers are inserted back while calculating the P2RP and CD. Often, the top-most layers associated with a layout of a circuit design are made using relatively thicker metals for power and ground terminals in order to discharge the current during an ESD event. Removal of such relatively thick layers may be a source of accuracy loss if their associated nodes are pruned. By using the layer-order information and the thickness of the layer from the available manufacturing process, layers that are relatively thick may be quickly identified and inserted back in calculating the P2RP and CD as part of the auto-layer preserving technique.

In the following, where used, an edge {A, B} represents a line connecting a pair of nodes A and B. Where used, a graph G is represented by a pair G=(V, E), where V is a set whose elements are nodes, and E is a set whose elements are edges. In the description below, (i) a node represents a polygon associated with an IC design layout, and (ii) an edge represents a geometric overlapping between two such polygons.

As is known, a semiconductor integrated circuit includes multiple layers of materials. The order in which the layers are formed and processed, as well as their thicknesses, are known in advance. In accordance with embodiments of the present disclosure, in a directed graph representative of a circuit design, a directed edge from node A to node B is considered valid if (i) layer $L_A$ representative of node A, and layer $L_B$ representative of node B are connected in a predefined layer-stack of a semiconductor manufacturing process, and (ii) layer $L_B$ is not lower than layer $L_A$. A directed graph is a graph in which the edges are directed edges. The information about the thickness of each layer and the order between the layers is referred to herein as layer-order.

FIG. 1 shows an example of a multitude of polygons A, B, C, D, E, F, G, H associated with a layout of a circuit design. Polygons A, B, C, D, are shown as being associated with the same layer of the IC design, and polygons E, F, G, H are associated with another layer of the circuit design. It is understood that a circuit design layout may include many more layers and polygons that are not shown in this example for simplicity. Polygons E, F, G, H are shown using a relatively lighter shade and polygons A, B, C and D are shown using a relatively darker shade.

Figure 2:
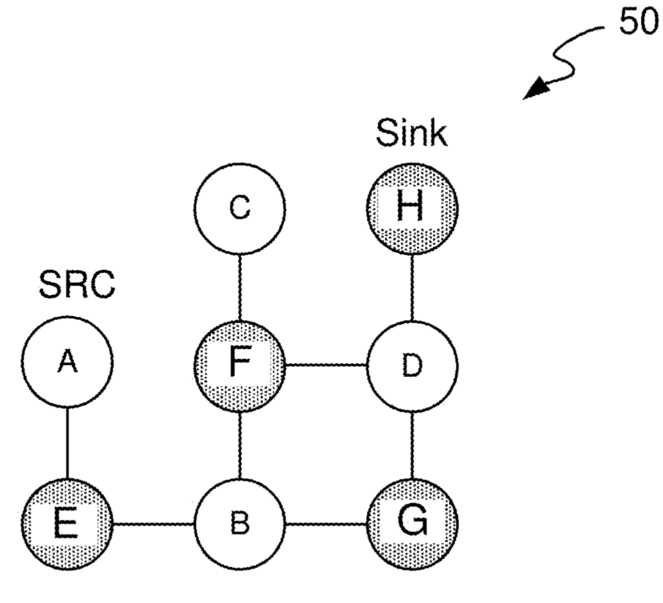
FIG. 2 is an example of a graph representing the polygons shown in FIG. 1.

FIG. 2 shows the polygons of FIG. 1 in the form of graph 50. Each polygon is shown as a node. Because polygon E overlaps polygons A and B, nodes A and B in graph 50 of FIG. 1B—corresponding to polygons A and B in FIG. 1A—are shown as being connected to one another via node E. Similarly, because polygon F overlaps polygons B, D and C, nodes B, D and C in graph 50 of FIG. 2—corresponding to polygons B, D and C in FIG. 1—are shown as being connected to one another via node F. In FIGS. 1 and 2, node A is shown as being a source node (SRC) from which the current is injected, and node H is shown as being a sink node (Sink), in which the injected current sinks. The P2PR and CD calculations are performed by solving, simultaneously, a system of linear equations that relate the voltage-current characteristics of the nodes in order to determine the equivalent resistance between the source node and the sink node. For each P2PR calculation, the nodes connected between the source node and the sink node are received as inputs to the parasitic resistance extractor.

In accordance with one aspect of the present disclosure, nodes that are identified as having no impact (i.e., to which no current flows) on the P2PR calculation are pruned, i.e., discarded. For example, as seen from FIG. 2, the current injected into source node A node cannot flow through node C. Accordingly, node C is considered a redundant node. Because node C has no impact on the P2PR calculation, node C is discarded from further consideration in this example.

In accordance with one aspect of the present disclosure, a circuit design layout is first represented by a graph. The order in which various layers of a circuit are formed using a semiconductor manufacturing process is then used to convert the graph into a directed graph. Thereafter, the data size represented by the graph is reduced by pruning the graph nodes. To achieve this, the graph is traversed from a starting node to an ending node via edges of the graph. All the nodes that are visited during the traversal are maintained for P2PR calculation, and all the nodes that are not visited during the traversal are pruned. An algorithm, such as breadth-first-search (BFS), or depth-first-search (DFS) method may be used for the traversal.

Figure 3:
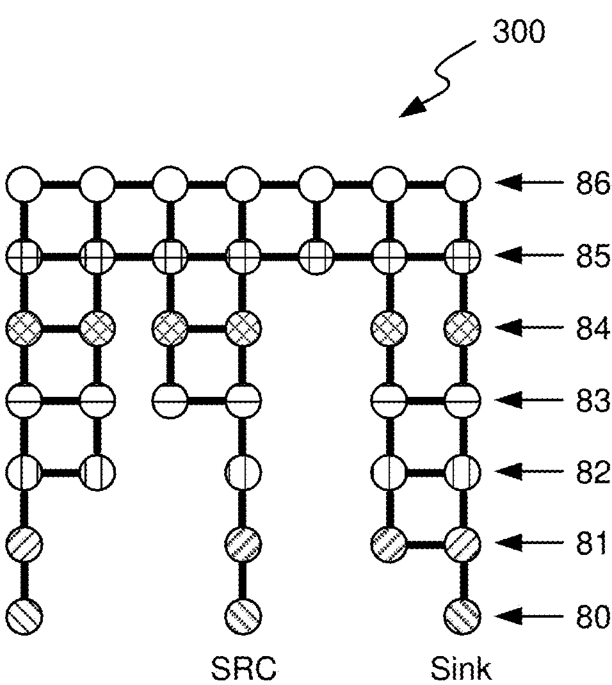
FIG. 3 shows a graph having a multitude of nodes associated with a number of layers of a circuit design layout.

FIG. 3 shows the nodes of an example graph 300 representing a circuit design layout. The nodes are disposed along seven different manufacturing process layers 80-86, shown along 7 different rows. The lowest layer in FIG. 3 is identified as layer 80, and the highest layer as layer 86. Layers 81-85, disposed between the lowest layer 80 and the highest layer 86, represent the increasing order in which the layers are formed during a manufacturing process. FIG. 3 also shows the source node "Src1" in which a current is injected, and the sink node "Sink1" from which node the current is delivered to a ground terminal.

Figure 4:
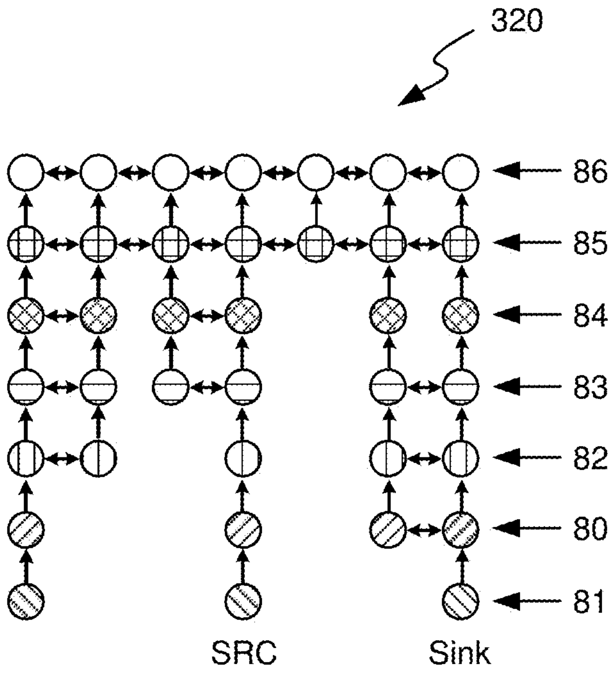
FIG. 4 shows the graph of FIG. 3 after the graph is converted to a directed graph.

FIG. 4 shows graph 320 obtained after graph 300 is converted to a directed graph by permitting traversal only from the nodes positioned in a lower layer to the nodes positioned in the same or a higher layer. Layer order traversal is not permitted from a higher layer node to a lower layer node. The direction of the traversal from a lower layer node to a higher layer node is represented by the arrows pointing in the up direction. The direction of the traversal between two nodes positioned in the same layer is represented by the double-headed arrows pointing along the horizontal direction.

Layer-Order Traversal

Figure 5:
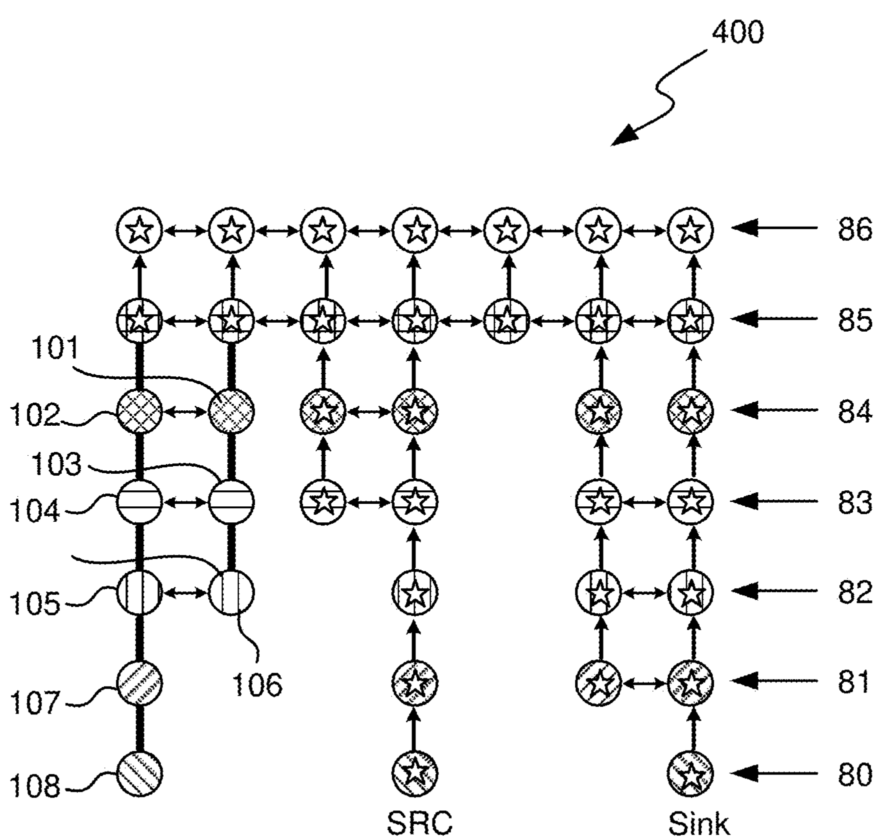
FIG. 5 shows the graph of FIG. 4 after performing a layer-order traversal, in accordance with one embodiment of the present disclosure.

FIG. 5 shows graph 400 obtained after graph 320 is traversed from node SRC1 to node Sink1 via edges of the graph using a DFS method. All the nodes that are visited during the traversal are maintained for the P2PR calculation, and all the nodes that are not visited during the traversal are pruned. Nodes 101, 102, 103, 104, 105, 106, 107 and 108 are not visited during the traversal and are thus pruned. Without pruning, all the 38 nodes shown in graph 400 are used in the P2PR and CD calculations. With pruning, in accordance with embodiments of the present disclosure and as shown in FIG. 5, only the 30 nodes that are visited are used in the P2PR and CD calculation.

In a semiconductor manufacturing process, the higher layers are more critical in aggregating the currents received from the lower layers, as the higher layers are represented by polygons that are relatively larger and have relatively smaller parasitic resistances. Therefore, the polygons associated with nodes in the lower layers of manufacturing process are not as critical in the P2PR and CD calculations as are the higher layers. Pruning of the layers, therefore, will not impact the P2PR and CD calculation accuracy uniformly as some layers have more impact on the calculations than other layers. In accordance with another aspect of the present disclosure, nodes associated with layers considered critical to the P2PR and CD calculations and that were pruned during the layer-order traversal, are reinserted prior to the P2PR and CD calculations using an auto-layer preserving method as described below. The critical layers may be determined based on a ratio between the thicknesses of different layers.

Auto-Layer Preserving

Since upper layers of a manufactured circuit usually have a relatively larger thickness and are used as power and ground terminals to carry most of the current during an ESD event, in accordance with one aspect of the present disclosure, layer thicknesses from the highest layer to the lowest layer are used in determining the layers that are to be preserved and reinserted prior to the P2PR and CD calculations. The data associated with layer thickness are available from the foundry that manufactures the circuit, or may be obtained using a resistance extraction tool.

The layer thicknesses may thus be used to generate a layers list sorted by the layer's name and thickness. Below is an example of a list of layers conducting current in a semiconductor manufacturing process and their corresponding normalized thicknesses in the order in which the layers are formed during a manufacturing process. Each pair of successive layers, such as layer pair Metal14 and Metal15, are alternatively referred to herein as adjacent layers. A number of metal layers are shown as having a corresponding pin layer that are part of the same layer. For example, metal layer 14 "Metal14" and its corresponding metal layer 14 pin "Metal14_Pin" are formed using the same metal layer 14. Although only seven distinct layers are shown in the example below, it is understood that a semiconductor manufacturing process often includes many more layers.

Layer's List

PAD_DEV=2.8
MetalTop=2.8
MetalTop_Pin=2.8
Metal15=1.15
Metal15_Pin=1.15
Metal14=1.15
Metal14_Pin=1.15
Metal13=0.2613
Metal13_Pin=0.2613
Metal12=0.2613
Metal12_Pin=0.2613
Metal11=0.1157

In accordance with one aspect of the present disclosure, to determine whether any of the nodes pruned during the layer order traversal is be inserted back in the P2PR and CD calculations, the ratio between the thicknesses of different layers are first computed. For the example above, the first thickness ratio (MetalTop/Metal15) is 2.8/1.15=2.234; the second thickness ratio (Metal14/Metal13) is 1.15/0.263=4.401, and the third thickness ratio (Metal12/Metal11) is 0.2613/0.1157=2.25. Because the highest ratio in this example is 4.401, all layers above and including Metal12_Pin are preserved. Therefore, any nodes positioned above and including Metal12_Pin layers that may have been pruned during the layer-order traversal is inserted back in the P2PR and CD calculations. The P2PR and CD calculations are subsequently used to determine the ESD current.

For example, referring to FIG. 5, as it was described above, nodes not designated with a star, including nodes 101 and 102 associated with layer 84 are not kept during the layer-order traversal and are thus pruned. However, if during the auto-layer preserving, it is determined that layer 84 is a critical layer, as described above, all nodes associated with layer 84 including nodes 101 and 102 are inserted back in the P2PR and CD calculations.

Table I below shows, in part, the run time and output data size associated with P2PR calculation of an IC design to be manufactured using a 5 nanometer (nm) process technology. A graph associated with the design, as described above, has nearly 12 billion nodes. The first row of Table I shows the run time and output data size when all the nodes are used in calculation of the P2PR. The second row of Table I shows the run time and output data size associated with calculation of the P2PR of the same IC design as determined in accordance with embodiments of the present disclosure.

TABLE I

| Run Time | Output Data Size | P2PR path percentage |
|---|---|---|
| 114:47:31 | 11,773,047,291 | 100 |
| 10:59:43 | 186,598,989 | 97.83 |

As seen from Table I, more than 114 hours and 47 minutes are consumed when all the nodes associated with the design are used in calculation of the P2PR, as reflected in the percentage 100 shown in the third column. The number of nodes associated with the first row is 11,773,047,291. Embodiments of the present disclosure reduce the number of nodes to 186,598,989 and consume a substantially shorter time of 10 hours and 59 minutes in calculating the same P2PR which is shown as having 97.83 percentage accuracy. The P2PR path percentage, which is a measure of accuracy, is indicative of the percentage of the paths in the P2PR and ESD calculations that are above 50% compared to a baseline that uses all the nodes in the P2PR calculations.

Figure 6:
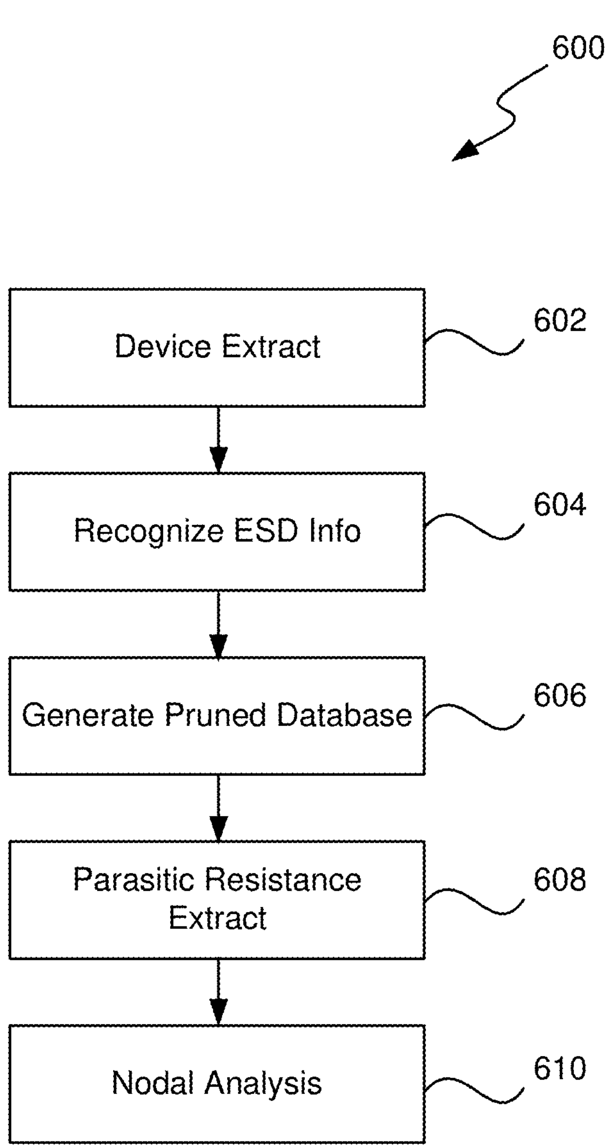
FIG. 6 shows a flowchart for calculating the point-to-point resistance and the current density associated with a circuit design layout, in accordance with one embodiment of the present disclosure.

FIG. 6 is a flowchart 600 for performing point-to-point resistance (P2PR) and current density (CD) calculation, in accordance with one embodiment of the present disclosure, in order to determine the ESD current. At 602, a list of devices, such as transistors, disposed in the circuit design, and their connectivity, is compiled from the layout of the circuit design to generate a netlist of the design. At 604, form the netlist generated at 602, and from information provided by a user about the ESD structure disposed in the circuit design and devices connected to the ESD structure, a list of the devices which affect the P2PR and CD calculation are identified. At 606, a directed graph representative of the circuit layout is generated. The directed graph is then pruned using the layer-order traversal method to determine a first set of nodes with the remaining nodes pruned away. Thereafter, nodes associated with layers considered critical to the P2PR and CD calculations and that were pruned during the layer-order traversal are reinserted to the first set of nodes to determine a second set of nodes, as described using the auto-layer preserving method. In one embodiment, the second set of nodes are stored in a database. At 608, the parasitic resistances associated with the second set of nodes are extracted using a parasitic resistance extractor tool. At 610 during the nodal analysis, the P2RP and CD calculations are performed using the parasitic resistances extracted at 608. The P2PR and CD calculations are subsequently used to determine the ESD current.

Figure 7:
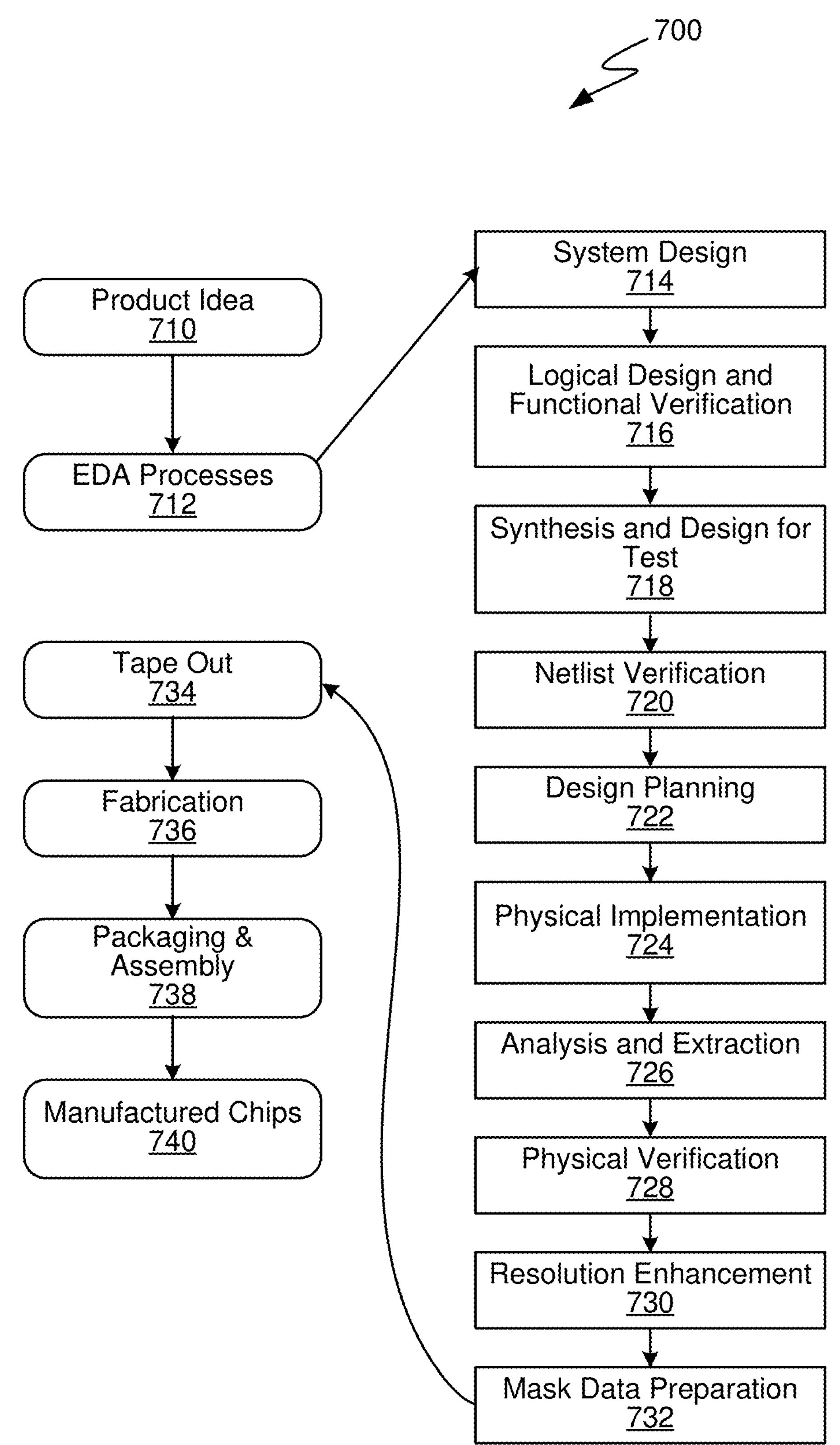
FIG. 7 depicts a flowchart of various processes used during the design and manufacture of an integrated circuit in accordance with some embodiments of the present disclosure.

FIG. 7 illustrates an example set of processes 700 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 710 with information supplied by a designer, information which is transformed to create an article of manufacture that uses a set of EDA processes 712. When the design is finalized, the design is taped-out 734, which is when artwork (e.g., geometric patterns) for the integrated circuit is sent to a fabrication facility to manufacture the mask set, which is then used to manufacture the integrated circuit. After tape-out, a semiconductor die is fabricated 736 and packaging and assembly processes 738 are performed to produce the finished integrated circuit 740.

Specifications for a circuit or electronic structure may range from low-level transistor material layouts to high-level description languages. A high-level description may be used to design circuits and systems, using a hardware description language ('HDL') such as VHDL, Verilog, System Verilog, SystemC, MyHDL or OpenVera. The HDL description can be transformed to a logic-level register transfer level ('RTL') description, a gate-level description, a layout-level description, or a mask-level description. Each lower level description adds more useful detail into the design description, for example, more details for the modules that include the description. The lower levels of description can be generated by a computer, derived from a design library, or created by another design automation process. An example of a specification language at a lower level language for specifying more detailed descriptions is SPICE, which is used for detailed descriptions of circuits with many analog components. Descriptions at each level is enabled for use by the corresponding tools of that layer (e.g., a formal verification tool). A design process may use a sequence depicted in FIG. 7. The processes described by be enabled by EDA products (or tools).

During system design 714, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 716, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 718, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 720, the netlist is checked for compliance with timing constraints and for correspondence with the HDL code. During design planning 722, an overall floor plan for the integrated circuit is constructed and analyzed for timing and top-level routing.

During layout or physical implementation 724, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 726, the circuit function is verified at the layout level, which permits refinement of the layout design. During physical verification 728, the layout design is checked to ensure that manufacturing constraints are correct, such as DRC constraints, electrical constraints, lithographic constraints, and that circuitry function matches the HDL design specification. During resolution enhancement 730, the geometry of the layout is transformed to improve how the circuit design is manufactured.

During tape-out, data is created to be used (after lithographic enhancements are applied if appropriate) for production of lithography masks. During mask data preparation 732, the 'tape-out' data is used to produce lithography masks that are used to produce finished integrated circuits.

A storage subsystem of a computer system (such as computer system 900 of FIG. 8) may be used to store the programs and data structures that are used by some or all of the EDA products described herein, and products used for development of cells for the library and for physical and logical design that use the library.

Figure 8:
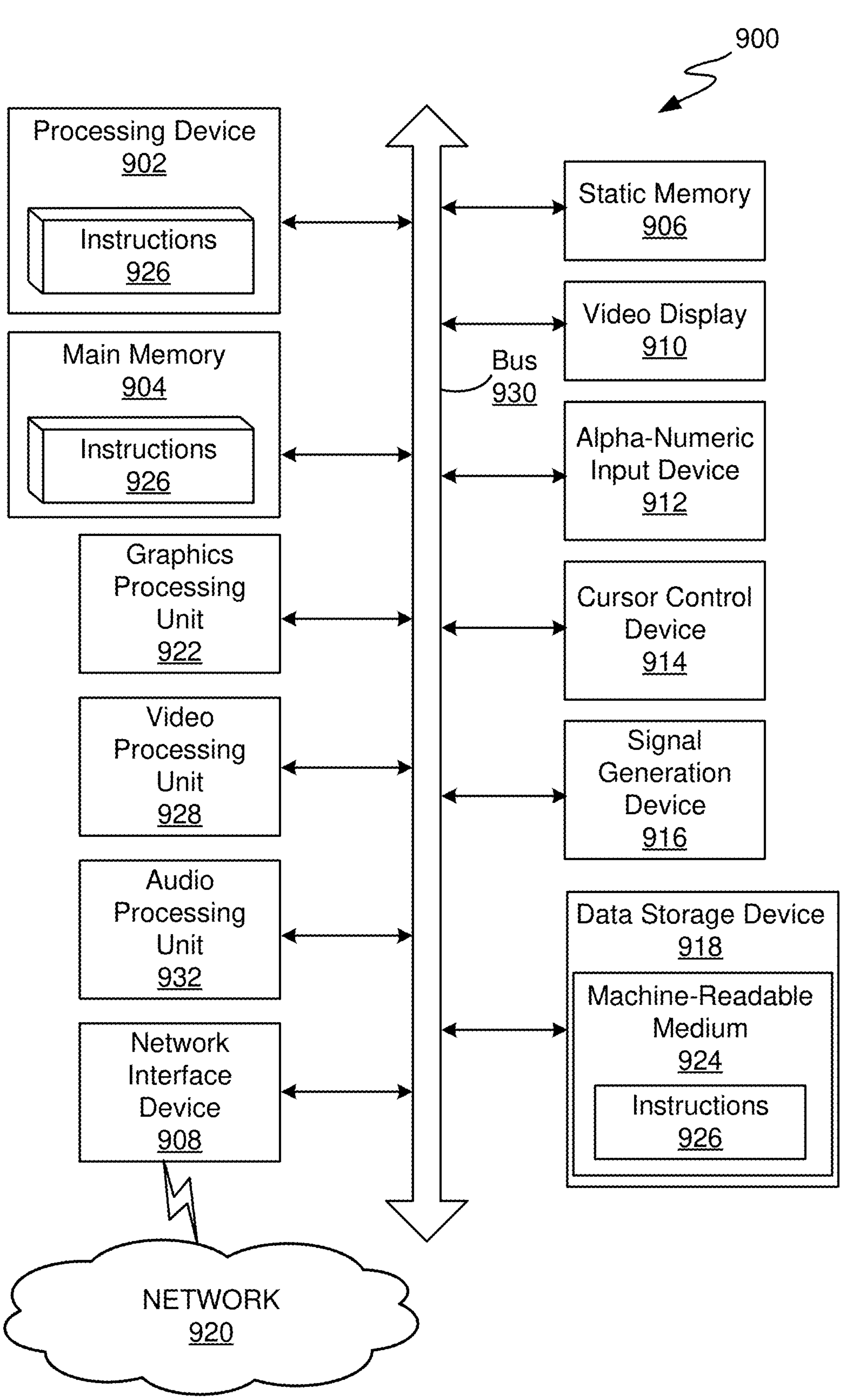
FIG. 8 depicts an example diagram of an example computer system in which embodiments of the present disclosure may operate.

FIG. 8 illustrates an example machine of a computer system 900 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM), a static memory 906 (e.g., flash memory, static random access memory (SRAM), etc.), and a data storage device 918, which communicate with each other via a bus 930.

Processing device 902 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 may also be one or more special-purpose processing devices such as an application specific integrated circuit (ASIC), a field programmable gate array (FPGA), a digital signal processor (DSP), network processor, or the like. The processing device 902 may be configured to execute instructions 926 for performing the operations and steps described herein.

The computer system 900 may further include a network interface device 908 to communicate over the network 920. The computer system 900 also may include a video display unit 910 (e.g., a liquid crystal display (LCD) or a cathode ray tube (CRT)), an alphanumeric input device 912 (e.g., a keyboard), a cursor control device 914 (e.g., a mouse), a graphics processing unit 922, a signal generation device 916 (e.g., a speaker), graphics processing unit 922, video processing unit 928, and audio processing unit 932.

The data storage device 918 may include a machine-readable storage medium 924 (also known as a non-transitory computer-readable medium) on which is stored one or more sets of instructions 926 or software embodying any one or more of the methodologies or functions described herein. The instructions 926 may also reside, completely or at least partially, within the main memory 904 and/or within the processing device 902 during execution thereof by the computer system 900, the main memory 904 and the processing device 902 also constituting machine-readable storage media.

In some implementations, the instructions 926 include instructions to implement functionality corresponding to the present disclosure. While the machine-readable storage medium 924 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 902 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

FIG. 7 illustrates an example machine of a computer system 900 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM), a static memory 906 (e.g., flash memory, static random access memory (SRAM), etc.), and a data storage device 918, which communicate with each other via a bus 930.

Processing device 902 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 may also be one or more special-purpose processing devices such as an application specific integrated circuit (ASIC), a field programmable gate array (FPGA), a digital signal processor (DSP), network processor, or the like. The processing device 902 may be configured to execute instructions 926 for performing the operations and steps described herein.

The computer system 900 may further include a network interface device 908 to communicate over the network 920. The computer system 900 also may include a video display unit 910 (e.g., a liquid crystal display (LCD) or a cathode ray tube (CRT)), an alphanumeric input device 912 (e.g., a keyboard), a cursor control device 914 (e.g., a mouse), a graphics processing unit 922, a signal generation device 916

(e.g., a speaker), graphics processing unit 922, video processing unit 928, and audio processing unit 932.

The data storage device 918 may include a machine-readable storage medium 924 (also known as a non-transitory computer-readable medium) on which is stored one or more sets of instructions 926 or software embodying any one or more of the methodologies or functions described herein. The instructions 926 may also reside, completely or at least partially, within the main memory 904 and/or within the processing device 902 during execution thereof by the computer system 900, the main memory 904 and the processing device 902 also constituting machine-readable storage media.

In some implementations, the instructions 926 include instructions to implement functionality corresponding to the present disclosure. While the machine-readable storage medium 924 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 902 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, and the like.

The invention claimed is:

1. A method for performing a computation associated with a layout of a circuit design, the method comprising:
- generating a graph having a plurality of nodes disposed across a plurality of layers associated with the layout, wherein each of the plurality of nodes corresponds to a polygon in the layout, wherein the plurality of nodes comprises a source node and a sink node;
- traversing from the source node to the sink node via the plurality of the nodes in accordance with a rule enabling traversal between one or more of (i) nodes disposed in a same layer, and (ii) from a first node disposed in a first one of the plurality of layers to a second node disposed in a second one of the plurality of layers that is higher than the first one of the plurality of layers;
- pruning nodes that are not visited during the traversal; and
- maintaining nodes that are not pruned for the computation.

2. The method of claim 1 further comprising:
- computing a plurality of ratios associated with thicknesses of the plurality of layers;
- reinserting the pruned nodes associated with layers having computed ratios that satisfy a first ratio and that are positioned at one or more of a same layer level and above the layer level associated with the first ratio; and
- using the maintained nodes and the reinserted nodes to perform the computation.

3. The method of claim 2 further comprising:
- computing a resistance associated with each of the plurality of nodes.

4. The method of claim 1 wherein the plurality of layers is a plurality of conductive layers.

5. The method of claim 1 wherein the traversing from the source node to the sink node is performed in accordance with one or more of a breadth-first-search algorithm and a depth-first-search algorithm.

6. The method of claim 1 wherein the computation computes an electro-static discharge current sourced by the source node and received by the sink node.

7. The method of claim 2 wherein the computed ratios are equal to or less than the first ratio.

8. A system for performing a computation associated with a layout of a circuit design, the system comprising:

a memory storing instructions; and a processor, coupled with the memory and to execute the instructions, the instructions when executed cause the processor to:

generate a graph having a plurality of nodes disposed across a plurality of layers associated with the layout, wherein each of the plurality of nodes corresponds to a polygon in the layout, wherein the plurality of nodes comprises a source node and a sink node;

traverse from the source node to the sink node via the plurality of the nodes in accordance with a rule enabling traversal between one or more of (i) nodes disposed in a same layer, and (ii) from a first node disposed in a first one of the plurality of layers to a second node disposed in a second one of the plurality of layers that is higher than the first one of the plurality of layers;

prune nodes that are not visited during the traversal; and maintain nodes that are not pruned for the computation.

9. The system of claim 8 wherein the instructions further cause the processor to:

compute a plurality of ratios associated with thicknesses of the plurality of layers;

reinsert the pruned nodes associated with layers having computed ratios that satisfy a first ratio and that are positioned at one or more of a same layer level and above the layer level associated with the first ratio; and use the maintained nodes and the reinserted nodes to perform the computation.

10. The system of claim 9 wherein the instructions further cause the processor to:

compute a resistance associated with each of the plurality of nodes.

11. The system of claim 8 wherein the plurality of layers is a plurality of conductive layers.

12. The system of claim 8 wherein the traversing from the source node to the sink node is performed in accordance with a breadth-first-search algorithm or a depth-first-search algorithm.

13. The system of claim 9 wherein the computation computes an electro-static discharge current sourced by the source node and received by the sink node.

14. The system of claim 9 wherein the computed ratios are equal to or less than the first ratio.

15. A non-transitory computer readable medium comprising stored instructions, which when executed by a processor, cause the processor to:

generate a graph having a plurality of nodes disposed across a plurality of layers associated with the layout, wherein each of the plurality of nodes corresponds to a polygon in the layout, wherein the plurality of nodes comprises a source node and a sink node;

traverse from the source node to the sink node via the plurality of the nodes in accordance with a rule enabling traversal between one or more of (i) nodes disposed in a same layer, and (ii) from a first node disposed in a first one of the plurality of layers to a second node disposed in a second one of the plurality of layers that is higher than the first one of the plurality of layers;

prune nodes that are not visited during the traversal; and maintain nodes that are not pruned for a computation associated with a layout of a circuit design.

16. The non-transitory computer readable medium of claim 15 wherein the instructions further cause the processor to:

compute a plurality of ratios associated with thicknesses of the plurality of layers;

reinsert the pruned nodes associated with layers having computed ratios that satisfy a first ratio and that are positioned at one or more of a same layer level and above the layer level associated with the first ratio; and use the maintained nodes and the reinserted nodes to perform the computation.

17. The non-transitory computer readable medium of claim 15 wherein the instructions further cause the processor to:

compute a resistance associated with each of the plurality of nodes.

18. The non-transitory computer readable medium of claim 15 wherein the plurality of layers is a plurality of conductive layers.

19. The non-transitory computer readable medium of claim 15 wherein the computation computes an electro-static discharge current sourced by the source node and received by the sink node.

20. The non-transitory computer readable medium of claim 15 wherein the computed ratios are equal to or less than the first ratio.

* * * * *